(12) United States Patent
Kull et al.

(10) Patent No.: US 9,455,695 B2
(45) Date of Patent: Sep. 27, 2016

(54) HIGH-SPEED COMPARATOR FOR ANALOG-TO-DIGITAL CONVERTER

(71) Applicant: International Business Machines Corporation, Armonk, NY (US)

(72) Inventors: Lukas Kull, Zurich (CH); Thomas H. Toifl, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/834,871

(22) Filed: Aug. 25, 2015

(65) Prior Publication Data

US 2016/0065229 A1 Mar. 3, 2016

(30) Foreign Application Priority Data

Aug. 29, 2014 (GB) .................................. 1415289.6

(51) Int. Cl.
*H03K 5/24* (2006.01)
*H03M 1/44* (2006.01)

(52) U.S. Cl.
CPC ................ *H03K 5/249* (2013.01); *H03M 1/44* (2013.01)

(58) Field of Classification Search
CPC .......................................... H03M 1/38–1/466
USPC ..................................................... 327/57, 65
See application file for complete search history.

(56) References Cited

U.S. PATENT DOCUMENTS

| | | | |
|---|---|---|---|
| 5,764,175 A * | 6/1998 | Pan ....................... | H03M 1/162 327/52 |
| 6,600,437 B1 | 7/2003 | Confalonieri et al. | |
| 7,652,600 B2 * | 1/2010 | Van der Plas ...... | H03M 1/1061 327/55 |
| 7,733,258 B2 * | 6/2010 | Berens .................. | H03M 1/007 341/145 |
| 7,821,303 B2 * | 10/2010 | Naka .................... | H03K 5/2481 327/55 |
| 8,030,972 B2 | 10/2011 | Jansson | |
| 8,120,385 B2 | 2/2012 | Singh et al. | |
| 8,810,282 B2 | 8/2014 | Li | |
| 2013/0076553 A1 | 3/2013 | Kuo et al. | |

(Continued)

FOREIGN PATENT DOCUMENTS

| | | |
|---|---|---|
| GB | 2529686 A | 3/2016 |
| WO | 2011028674 A2 | 3/2011 |
| WO | 2013015672 A1 | 1/2013 |

OTHER PUBLICATIONS

Souliotis et al., An Offset Cancelation Technique for Latch Type Sense Amplifiers, Radioengineering, vol. 23, No. 4, Dec. 2014, pp. 1121-1128.*

(Continued)

*Primary Examiner* — Howard Williams
(74) *Attorney, Agent, or Firm* — Teddi E. Maranzano; Keivan E. Razavi (57) ABSTRACT

A comparator for an analog-to-digital converter is provided. The comparator includes a differential amplifier unit that receives a sampling signal and provides an output signal, based on a voltage provided by the sampling signal. The differential amplifier unit includes an input stage that receives the sampling signal and integrates a current on the integration nodes based on potentials of the sampling signal. The comparator includes a sense amplifier coupled with the integration nodes that detects a potential difference and amplifies the potential difference to generate the output signal. The comparator includes a charge injection circuit (30) to inject equal charges into the integration nodes.

9 Claims, 6 Drawing Sheets

(56) References Cited

U.S. PATENT DOCUMENTS

2014/0035772 A1   2/2014   Tsai et al.
2014/0266306 A1   9/2014   Cullinane

OTHER PUBLICATIONS

Figueiredo et al., Low kickback noise techniques for CMOS latched comparators, IEEE,. Proceedings of the 2004 International Symposium on Circuits and Systems, 2004. ISCAS '04.*

Search Report dated Feb. 23, 2015 for GB Application No. GB1415289.6, filed Aug. 29, 2014, 5 pages.

Tang, "A charge-pump and comparator based power-efficient pipelined ADC technique," Microelectronics Journal, vol. 43, Issue 3, Mar. 2012, pp. 1-2 (abstract only).

Miyahara et al, "A Low-Noise Self-Calibrating Dynamic Comparator for High-Speed ADCs," Solid-State Circuits Conference, A-SSCC '08. IEEE Asian, Nov. 3-5, 2008, pp. 269-272.

* cited by examiner

Figure 6 ated-to-digital Converter

BACKGROUND

The present invention relates to comparators, in particular for use in analog-to-digital converters such as successive approximation register (SAR) analog-to-digital converters and measures to increase the precision of comparators.

Successive approximation register (SAR) converters for analog-to-digital conversion are used in integrated CMOS devices since they provide a reasonable resolution and conversion time and can be implemented by optimally utilizing the advantages of CMOS technology, for example small-sized switches and capacitors having well-defined relative capacitances.

Although SAR analog-to-digital converters can be implemented in different topologies, they generally include at least one capacitor array with capacitors of different values forming a 2C-C-network or forming a capacitance array network with capacitance values in relation of $2^N$ to one another. The capacitors of the capacitor array can be charged by being connected to an input signal line carrying an input signal potential to be converted. The capacitor array is connected to a latch/comparator which serves for evaluating a potential difference with respect to the potential stored in the capacitor array. The comparison result is subsequently stored in a shift register. Based on the comparison result of the previous sampling phase, the switching of one or more capacitors of the at least one capacitor array is performed to increase or decrease the potential stored in the at least one capacitor array before a next comparison is carried out.

With respect to conversion speed, power consumption and accuracy, the comparator is a critical element of such an analog-to-digital converter. By its evaluation time, the comparator affects the possible accuracy of the SAR analog-to-digital converter at a given conversion speed or the possible conversion speed at a given accuracy, since the comparators are responsible for a significant portion of 30% to 50% of the conversion time.

Furthermore, the comparators of an SAR analog-to-digital converter significantly contribute to the total power consumption of an analog-to-digital converter, for example between 20% and 70%. To evaluate the performance of an analog-to-digital converter, a figure of merit (FOM) has been defined which brings into relation power consumption, accuracy and sampling rate by $FOM=P/(2^{ENOB} \times f_s)$, whereby P is the power consumption, $f_s$ corresponds to the sampling rate and ENOB corresponds to the effective number of bits, i.e. as defined by the signal-to-noise-and-distortion ratio SNDR, as e. g. $ENOB=(SNDR-1.76)/6.02$. From the above relation it can be seen that in order to correspond to the above scheme and to maintain performance, an increase of performance of an analog-to-digital converter by increasing the comparison speed of the comparators by a factor of 2 does usually not result in an increase of power consumption by more than the factor 2. In practice, however, doubling the comparison speed often results in an increase of power consumption by a factor of 4. The same holds for increasing the conversion accuracy by 1 bit. This leads to a situation where a power-efficient implementation of a high-resolution analog-digital converter usually requires a significantly longer conversion time.

SUMMARY

According to an embodiment, an analog-to-digital converter comparator is provided. The comparator includes a differential amplifier unit that receives a sampling signal and provides an output signal depending on a voltage provided by the sampling signal. The differential amplifier unit includes an input stage that receives the sampling signal and integrates an electrical current on integration nodes depending on potentials of the sampling signal. The differential amplifier further includes a sense amplifier coupled with the integration nodes that detect a potential difference and amplifies the potential difference to generate the output signal and a charge injection circuit to inject equal charges into the integration nodes.

According to an embodiment, a method for operating an analog-to-digital converter is provided. The method includes receiving a sampling signal from a differential amplifier unit and providing by the differential amplifier unit an output signal based on a voltage provided by the sampling signal. The method includes operating the differential amplifier unit in a regeneration cycle and an integration cycle, whereby in the regeneration cycle integration nodes are set to a predefined potential and in the integration cycle a potential on the integration nodes is changed based on currents and based on the sampling signal, and injecting equal charges into the integration nodes during the integration cycle.

BRIEF DESCRIPTION OF THE SEVERAL VIEWS OF THE DRAWINGS

For a more complete understanding of this disclosure, reference is now made to the following brief description, taken in conjunction with the accompanying drawings and detailed description, wherein like reference numerals represent like parts.

DETAILED DESCRIPTION

Although an illustrative implementation of one or more embodiments is provided below, the disclosed systems and/or methods may be implemented using any number of techniques. This disclosure should in no way be limited to the illustrative implementations, drawings, and techniques illustrated below, including the exemplary designs and implementations illustrated and described herein, but may be modified within the scope of the appended claims along with their full scope of equivalents.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit", "module", or "system". Furthermore, aspects of the present invention may take the form of a computer program product embodied in one or more computer readable medium(s) having computer readable program code embodied thereon.

Aspects of the present disclosure are described below with reference to flowchart illustrations and/or block diagrams of methods, apparatus, (systems), and computer program products according to embodiments of the invention. It will be understood that each block of the flowchart illustrations and/or block diagrams, and combinations of blocks in the flowchart illustrations and/or block diagrams, can be implemented by computer program instructions.

Figure 1:
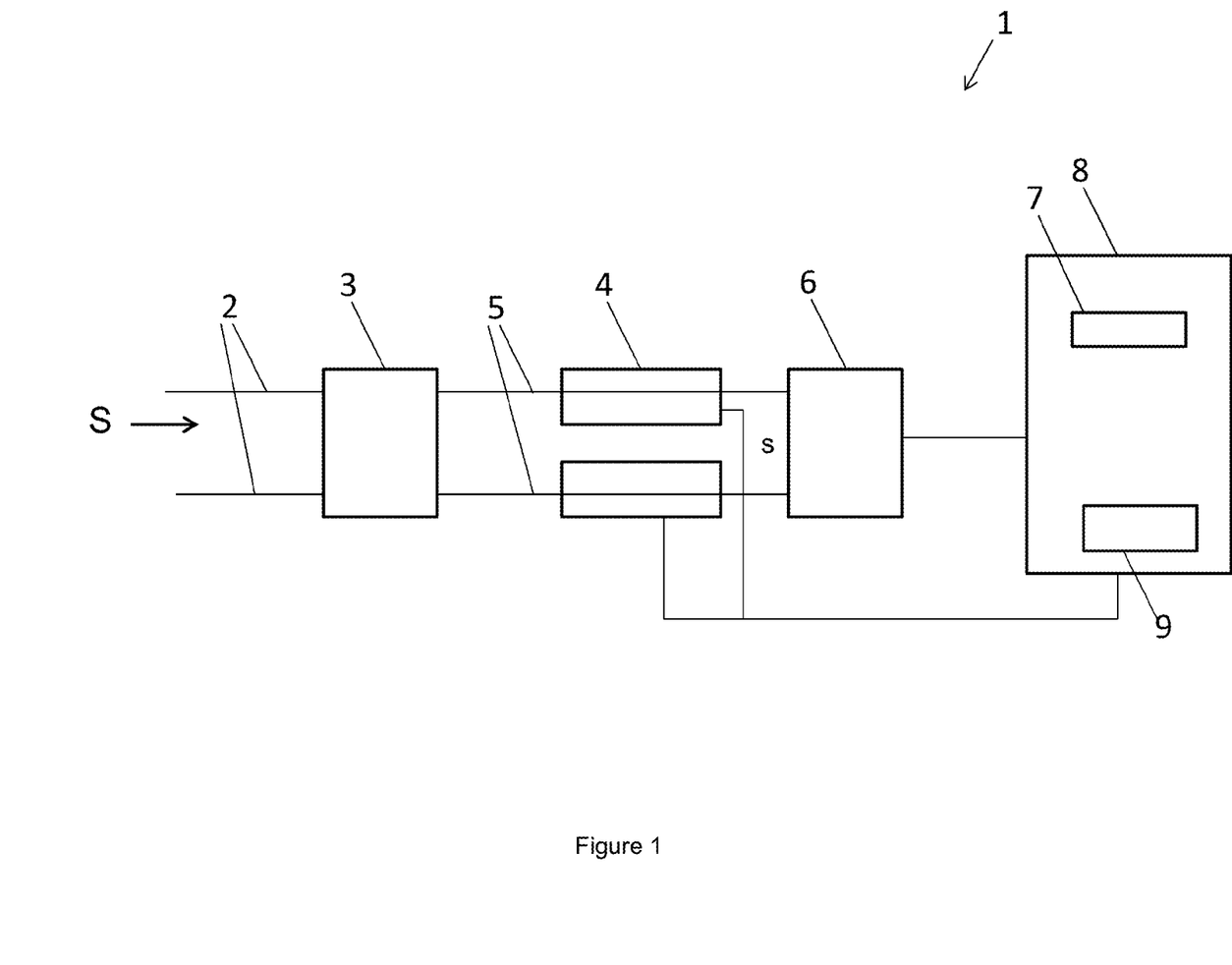
FIG. 1 shows a schematic diagram of an SAR analog-to-digital converter.

FIG. 1 schematically shows a block diagram of a successive approximation register analog-to-digital converter SAR ADC 1. An input signal S, preferably a differential input signal, is received at the input lines 2 and fed to a track-and-hold unit 3 which conserves the differential voltage value of the input signal S at a specific point in time and supplies the hold differential voltage of the input signal S as a sampling signal to a respective sampling signal line 5. Each sampling signal line 5 is coupled with a respective capacitor array 4. The potentials of the sampling signal are used to precharge capacitors in the capacitor arrays 4, whereafter the track-and-hold unit 3 is decoupled from the sampling signal lines 5.

Each capacitor of the capacitor arrays 4 is then charged as a response to the differential voltage of the sampling signal supplied on the sampling signal line 5. The capacitor array 4 can be implemented in a unit capacitor array topology or in a topology where the capacitances between the stages of the capacitor arrays 4 differ by a factor of $2^N$ (N=1 ... n, n=number of stages). In further embodiments, the basis of this factor can also be smaller than 2, if redundancy shall be provided.

The capacitor array 4 provides to the sampling signal line 5 a sampling voltage which corresponds to the supplied differential voltage of the sampling signal before a first comparison is performed. The sampling voltage is supplied to a comparator 6, which is also known as a decision latch.

The comparator 6 is operable to evaluate the sampling voltage at its input and to provide a digital decision result indicating whether the differential sampling voltage is higher or lower than a reference value, e. g. 0.

After each decision performed by the comparator 6, the decision results are collected and stored in a memory, such as a shift register 7 of a logic block 8, in which control signals are generated or merely provided corresponding to the entries in the shift register 7.

The logic block 8 further includes a logic unit 9 which processes the decision results stored in the shift register 7 in order to generate control signals to be applied to the capacitor arrays 4 for coupling selected capacitors with provided reference potentials according to known switching schemes for capacitor arrays 4 in SAR ADCs.

Figure 2:
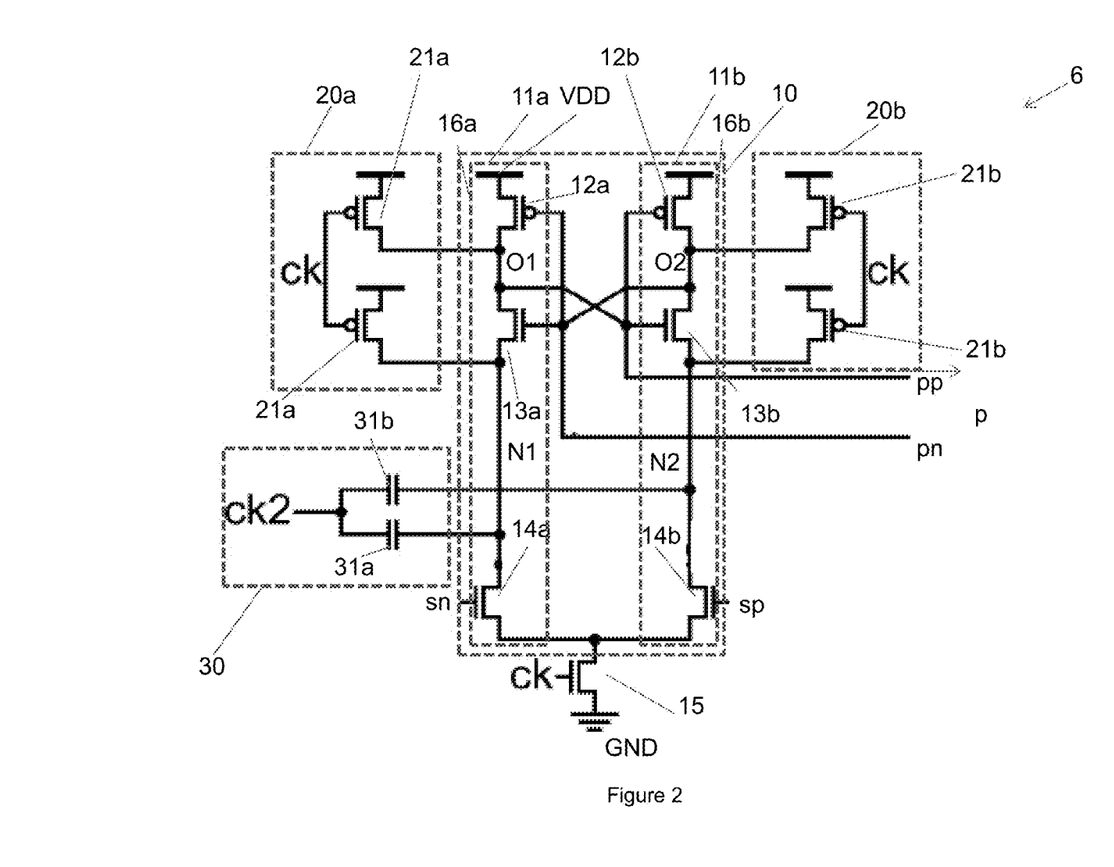
FIG. 2 shows a schematic diagram of a comparator with a charge injection circuit for use in the analog-to-digital converter of FIG. 1.

With respect to the comparator 6, a specific example is shown in FIG. 2. FIG. 2 includes a differential amplifier unit 10 having a first branch 11a and a second branch 11b. The first branch 11a has a series connection of a first pull-up inverter transistor 12a, a first pull-down inverter transistor 13a and a first input transistor 14a. Analogously, the second branch 11b has a second pull-up inverter transistor 12b, a second pull-down inverter transistor 13b and a second input transistor 14b.

In detail, the first pull-up inverter transistor 12a is of a first conductivity type, such as a p-type, and is connected with its source terminal to a first supply potential, such as a high potential VDD, and with its drain terminal to a drain terminal of the first pull-down inverter transistor 13a. The first pull-down inverter transistor 13a is of a second conductivity type, such as an n-type. So the first pull-up inverter transistor 12a and the first pull-down inverter transistor 13a form a first inverter 16a.

The first input transistor 14a is of a second conductivity type, such as an n-type. A source terminal of the first pull-down inverter transistor 13a is coupled with a drain terminal of the first input transistor 14a forming a first integration node N1. A source terminal of the first input transistor 14a is substantially coupled with a second supply potential, e. g. a ground potential GND, via a clocking transistor 15.

Analogously, the second pull-up inverter transistor 12b is of a first conductivity type, such as a p-type, and is connected with its source terminal to the first supply potential VDD and with its drain terminal to a drain terminal of the second pull-down inverter transistor 13b. The second pull-down inverter transistor 13b is of a second conductivity type, such as an n-type. So the second pull-up inverter transistor 12b and the second pull-down inverter transistor 13b form a second inverter 16b.

The second input transistor 14b is of a second conductivity type, such as an n-type. A source terminal of the second pull-down inverter transistor 13b is coupled with a drain terminal of the second input transistor 14b forming a second integration node N2. A source terminal of the second input transistor 14b is coupled with the second supply potential, e. g. the ground potential GND, via the clocking transistor 15.

Furthermore, the first and second input transistors 14a, 14b form an input stage and the source terminals of the first and second input transistors 14a, 14b are interconnected and connected to a drain terminal of the clocking transistor 15. The source terminal of the clocking transistor 15 is coupled to the second supply potential GND, so that the differential amplifier unit 10 can be switched on and off by a provided clock signal ck applied on a gate terminal of the clocking transistor 15.

The interconnected drain terminals of the first pull-up inverter transistor 12a and the first pull-down inverter transistor 13a are connected to a gate terminal of the second pull-down inverter transistor 13b, while the drain terminals of the second pull-up inverter transistor 12b and the second pull-down inverter transistor 13b are coupled with a gate terminal of the first pull-down inverter transistor 13a. Thereby, a cross-coupled inverter stage can be formed which acts as a sense amplifier, i e. to amplify a potential difference between the first and the second integration nodes N1, N2.

The inputs of the comparator 6 are provided at the gate terminals of the input transistors 14a, 14b, respectively, to receive the sampling potentials sn, sp of the sampling signal s applied by the capacitor arrays 4 after they have been controlled by the logic block 8. Further, the interconnected drain terminals of the first pull-up inverter transistor 12a and the first pull-down inverter transistor 13a as well as of the second pull-up inverter transistor 12b and the second pull-down inverter transistor 13b form the first and second output nodes O1, O2 of the comparator 6, where the decision result can be obtained in form of an output signal p with the output potentials pn, pp.

Each branch 11a, 11b is coupled with a respective reset circuit 20a, 20b respectively. The first branch 11a is connected with first reset transistors 21a which are respectively coupled to the interconnected drain terminals of the first pull-up inverter transistor 12a and the first pull-down inverter transistor 13a forming the first output node O1 and to the source terminal of the first pull-down inverter transistor 13a forming the first integration node N1, respectively.

Analogously, the second branch 11b is connected with second reset transistors 21b which are respectively coupled to the interconnected drain terminals of the second pull-up inverter transistor 12b and the second pull-down inverter transistor 13b forming the second output node O2 and to the source terminal of the second pull-down inverter transistor 13b forming the second integration node N1, respectively.

The gate terminals of the first and second reset transistors 21a, 21b as well as of the clocking transistor 15 are coupled with the clock signal ck.

The above described comparator 6 is of a sense amplifier type and is intermittently operated in two cycles, i e. in an amplification/integration cycle and in a reset cycle, as defined by the toggling of the clock signal ck. In the reset cycle, which, for example, may be indicated by a low level of the clock signal ck, the first and second output nodes O1, O2 (i e. the interconnected drain terminals of the first and second pull-up inverter transistors 12a, 12b and the first and second pull-down inverter transistors 13a, 13b) as well as the integration nodes N1, N2 (defined by the source terminal of the first and second pull-down inverter transistors 13a, 13b) are charged with a predefined potential, e. g. the first supply potential VDD, since the first and second regeneration transistors 21a, 21b are closed to a conductive state. At the same time the clocking transistor 15 is switched off, so that the differential amplifier unit 10 is substantially inoperable.

The following integration cycle can then be initiated, e. g. by a rising edge of the clock signal ck. The rising edge of the clock signal ck causes the reset transistors 21a, 21b to switch off and the clocking transistor 15 to switch on, thereby powering the differential amplifier unit 10 to be operational. Depending on the sampling potentials sn, sp of the differential sampling signal s applied on the gate terminals of the first and second input transistors 14a, 14b, the integration nodes N1, N2 formed by the source terminals of the first pull-down inverter transistors 13a and by the drain terminal of the first input transistors 14a and formed by the source terminal of the second pull-down inverter transistors 13b and the drain terminal of the second input transistors 14b are integrated such that their respective charges are reduced depending on the conductivity of the first and second input transistors 14a, 14b. The integration is caused since the integration nodes N1, N2 have respective capacitances (formed by specific or parasitic capacitances) which are each charged or discharged with a current provided by each of the input transistors 14a, 14b and depending on the sampling potentials sp, sn. With respect to the low differential voltage of the sampling signal s, the conductivities of the first and second input transistors 14a, 14b will be only slightly different, so that the discharging of the integration nodes N1, N2 occurs only slightly differently. Over time, a charge difference between the integrating nodes N1, N2 is generated and increases, whereby the charge difference becomes higher the longer the integration nodes N1, N2 are able to integrate.

The integration of the potential on the integration nodes N1, N2 will lead to a situation where the cross-coupled inverters 16a, 16b become active due to a sufficient voltage drop over the first and second inverter transistors 12a, 13a, 12b, 13b of each inverter 16a, 16b. Then a voltage difference on the integration nodes N1, N2 will result in spreading the potentials on the output nodes O1, O2 accordingly, thereby providing the required amplification of the sampling signal.

In particular in cases where a low supply voltage is provided, this might result in a situation where the potential of the integration nodes N1, N2 is decreasing very quickly due to integration after the rising edge of the clock signal ck. The time span for integrating the potential at the integration nodes N1, N2 until the cross-coupled inverters 16a, 16b become active is then short and the resulting potential difference at the integration nodes N1, N2 is low. Such a low potential difference at the integration nodes N1, N2 at the time the cross-coupled inverter 16a, 16b starts amplifying the potential difference involves an increased likelihood that interferences or the like causes the cross-coupled inverter 16a, 16b to misinterpret the potential difference at the integration nodes N1, N2 and to fail to provide a correct comparison result. Furthermore, particularly at a low supply voltage it prolongs the time for regeneration in the cross-coupled inverters, i.e. discrimination of the potential difference at the integration nodes N1, N2.

To prolong the time before the cross-coupled inverters 16a, 16b start the amplification of the potential difference at the integration nodes N1, N2, a charge injection into the integration nodes N1, N2 is provided by a charge injection circuit 30 before the cross-coupled inverters 16a, 16b become active. The charge injection circuit 30 has a capacitor 31a, 31b for each of the integration nodes N1, N2 which can be charged during the regeneration cycle with the first (high) supply potential VDD. The capacitors 31a, 31b each have a first terminal which is coupled to the respective integration node N1, N2 while second terminals of the capacitors 31a, 31b can be connected to a further clock signal ck2 or a potential which rises triggered by the further clock signal ck2. The further clock signal ck2 has the same frequency as the clock signal ck and can correspond or be temporally coupled to the clock signal ck, e. g. can be delayed for about 0% to 40% of a clock cycle of the clock signal ck. The further clock signal ck2 is preferably delayed with respect to the clock signal ck, so that the further clock signal ck2 should have its rising edge after the clock signal ck has arrived at its high level and it can be ensured that the reset transistors 21a, 21b are in a full non-conducting state.

On a rising edge of the further clock signal ck2, the charges of the charged capacitors 31a, 31b flow to the integration nodes N1, N2, thereby equally increasing their potentials and thus keeping the cross-coupled inverters 16a, 16b inactive for a longer time before they start amplifying the potential difference. This leads to a quicker evaluation of the applied sampling signal since the potential difference applied on the cross-coupled inverters 16a, 16b at the time of becoming active is higher, so that discrimination is improved.

It is a further advantage of providing the capacitors 31a, 31b that the overall capacities of the integration nodes N1, N2 are increased. This results in less noise on the integration nodes N1, N2 so that the noise performance is improved.

The above comparator can be configured to substantially inject additional charges into the integration nodes during integration, so that effectively a higher supply voltage can be emulated. Embodiments of the comparator can therefore provide the advantage that noise, speed and power trade-off of the comparator can be enhanced by an effectively increased supply voltage. Vice versa, good performance of the comparator can be achieved at low supply voltages. By injecting additional charges into the integration nodes the sense amplifier remains inactive for a longer period of time, so that a timely extended integration can be performed. This allows the integration to generate a higher potential difference on the integration nodes based on the potential difference of the sampling signal before the amplification of the sense amplifier actually starts.

Thereby, the potential of the integration node can be limited to a range in which the integration is carried out without the sense amplifier being active. Since at the time the sense amplifier becomes active due to the potential drop caused by the integration on the integration nodes, the potential difference between the integration nodes can be higher than without the charge injection and the evaluation can be performed more reliable with respect to interferences and the like.

Furthermore, the sense amplifier can include cross-coupled inverters. Particularly, one terminal of each of the cross-coupled inverters can be coupled with a respective one of the integration nodes, so that the voltage over the cross-coupled inverters depends on the potential on the respective integration node.

Charges can be selectively injected into the integration nodes before the voltage over the cross-coupled inverters reaches a value at which the sense amplifier becomes operational. As the integration potentials on the integration nodes determine the point in time the sense amplifier becomes active, the time until activation of the sense amplifier can be prolonged by injecting the equal charges into the integration nodes. The longer integration time results in a higher voltage between the integration nodes at the time the sense amplifier activates.

Moreover, the charge injection circuit comprises injection capacitors each of which is to be coupled with a respective one of the integration nodes, so that charges are selectively injected into the integration nodes. The injection capacitors firstly allow for injecting a predefined charge into each of the integration nodes and secondly increase the capacitance of the integration nodes such that the integration is slowed down, which also results in a greater potential difference at the point of time when the sense amplifier becomes active/operational.

According to one embodiment, the differential amplifier unit can be configured to be operated in a regeneration cycle and an integration cycle according to a provided clock signal, whereby in the regeneration cycle the differential amplifier unit is deactivated and the integration nodes are charged with a predefined reference potential and whereby in the integration cycle the differential amplifier unit is activated and charges are injected into the integration nodes.

Each of the injection capacitors of the charge injection circuit is coupled with a first terminal thereof with a respective one of the integration nodes, whereby changing a potential on a second terminal of the injection capacitors during the integration cycle charges are injected into the integration nodes.

Furthermore, the alteration of the potential on the second terminal of the injection capacitors can be caused by the clock signal or a delayed clock signal.

According to an embodiment, the alteration of the potential on the second terminal of the injection capacitors can be provided by an output of an inverter associated with each of the injection capacitors.

Moreover, the input of each of the inverters coupled with a respective one of the capacitors is either coupled with an inverted clock signal or with the integration node associated with the respective other of the injection capacitors, so that the potential change on the integration node is controlled by the potential change of the respective other integration node. This embodiment additionally provides a support of the amplification by the sense amplifier as the thresholds of the inverters are reached with a slight time offset, thereby providing a greater potential difference on the integration nodes.

The charge injection circuit can be configured to be selectively enabled by a provided enable signal, so that charges are injected into the integration nodes depending on the enable signal.

According to an embodiment of a further aspect, an analog-to-digital converter, particularly an SAR analog-to-digital converter, is provided including at least one sampling line for holding a sampling signal, a capacitor array coupled with each of the sampling lines and the comparator according to embodiments of the invention coupled with the at least one sampling line.

Figure 3:
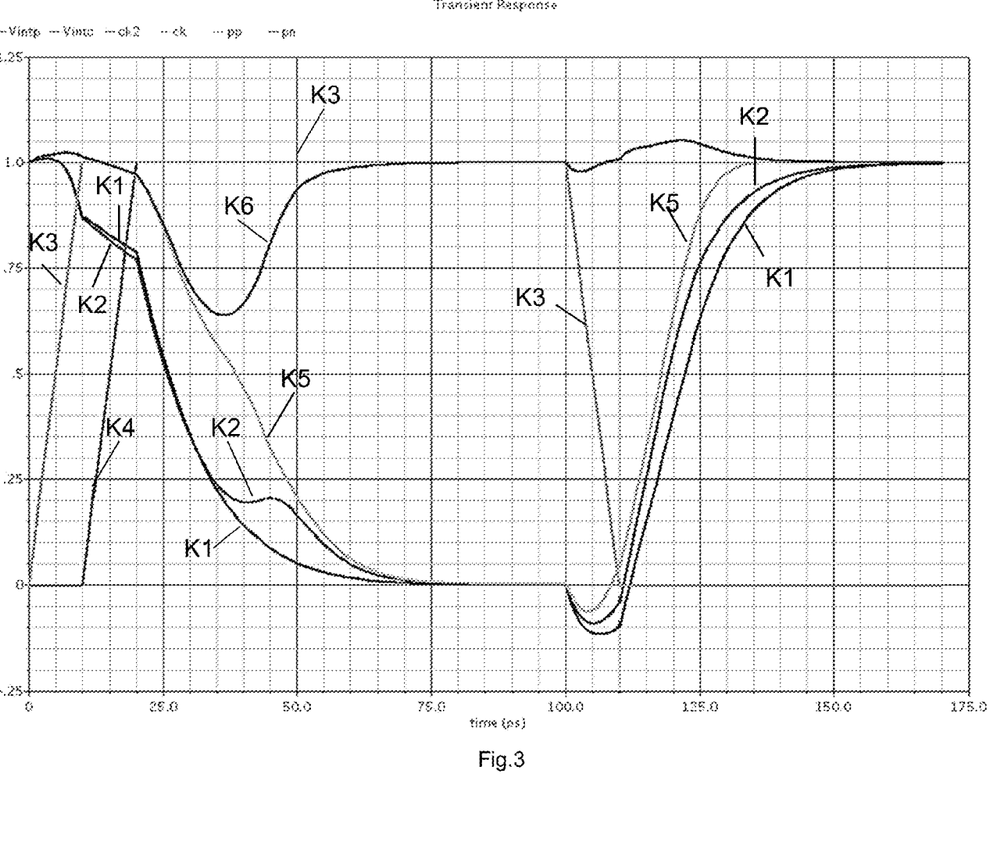
FIG. 3 shows the characteristics of the potentials on the integration nodes, the output nodes and the clock signals.

FIG. 3 shows a signal-time diagram illustrating the characteristics of the potentials of the integration nodes N1, N2 (curves K1, K2), the clock signals ck, ck2 (curves K3, K4) and the output potentials pp, pn (curves K5, K6). It can be seen that the potential drop on the integration nodes N1, N2 is delayed by the charge injection, so that the activation time at which the cross-coupled inverters 16a, 16b are activated is delayed. Thus, the integration of the potentials on the integration nodes N1, N2 has an extended period of time to provide a higher potential difference thereon before the evaluation of the cross-coupled inverters 16a, 16b starts.

Figure 4:
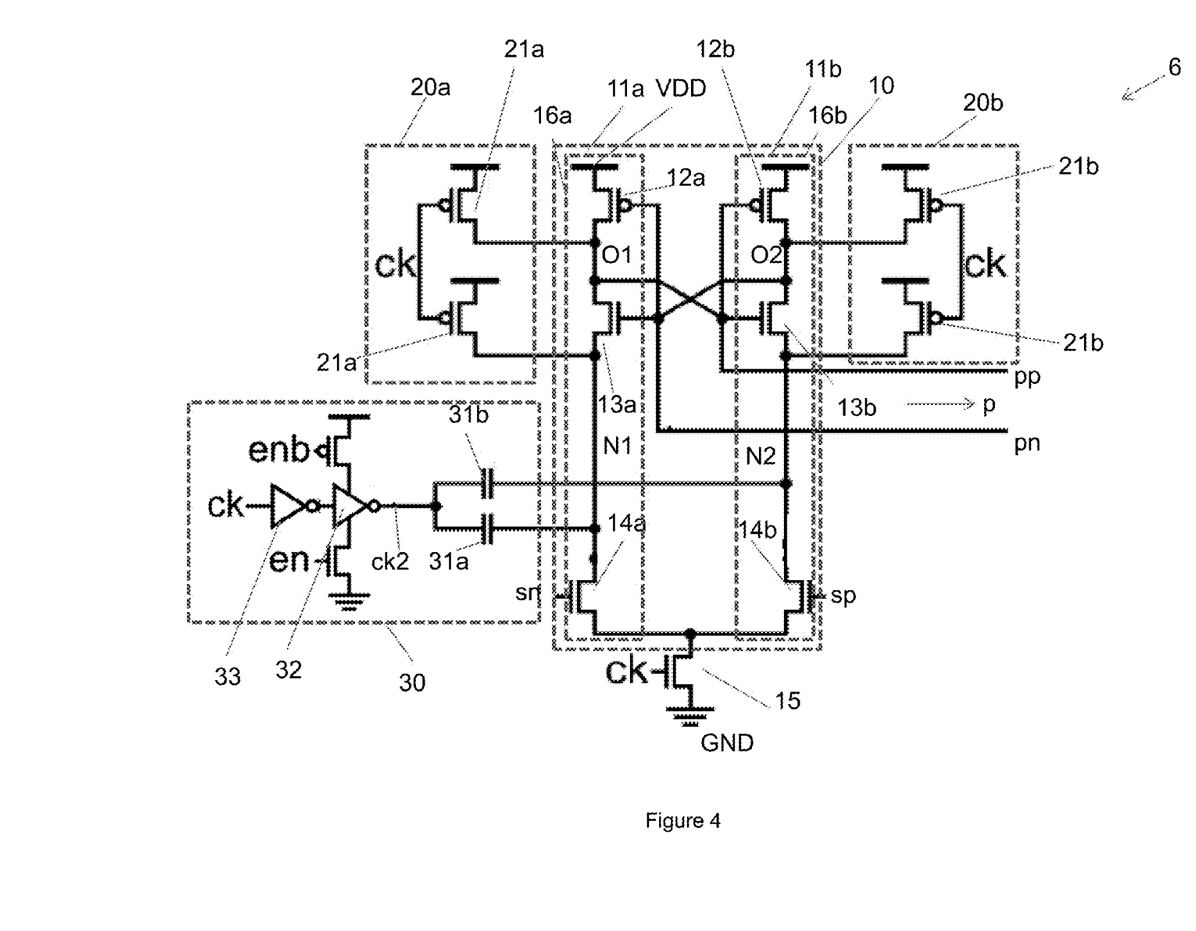
FIG. 4 shows a schematic diagram of the comparator of FIG. 2 including an enable circuitry for selectively applying the charge injection.

With respect to FIG. 4, which substantially corresponds to the circuit of the comparator 6 of FIG. 2, an enabling switch 32 is included. The enabling switch 32 has the form of an enable inverter which allows to switch on or off by means of an enable signal en the effect of the further clock signal ck2 applied to the second terminals of the capacitors 31a, 31b, so that the high precision mode can be switched on and off. The further clock signal ck2 can be generated by an additional inverter 33 and the enabling switch 32 which receives the clock signal ck, so that the clock signal ck is delayed by the inverter chain if it is enabled.

The enabling feature might be of advantage in many analog-to-digital converters where a high-accuracy or high-speed conversion is used for only a few cycles. In case the charge injection can be turned off in situations where the improved accuracy is not needed, a significant amount of power can be saved.

Figure 5:
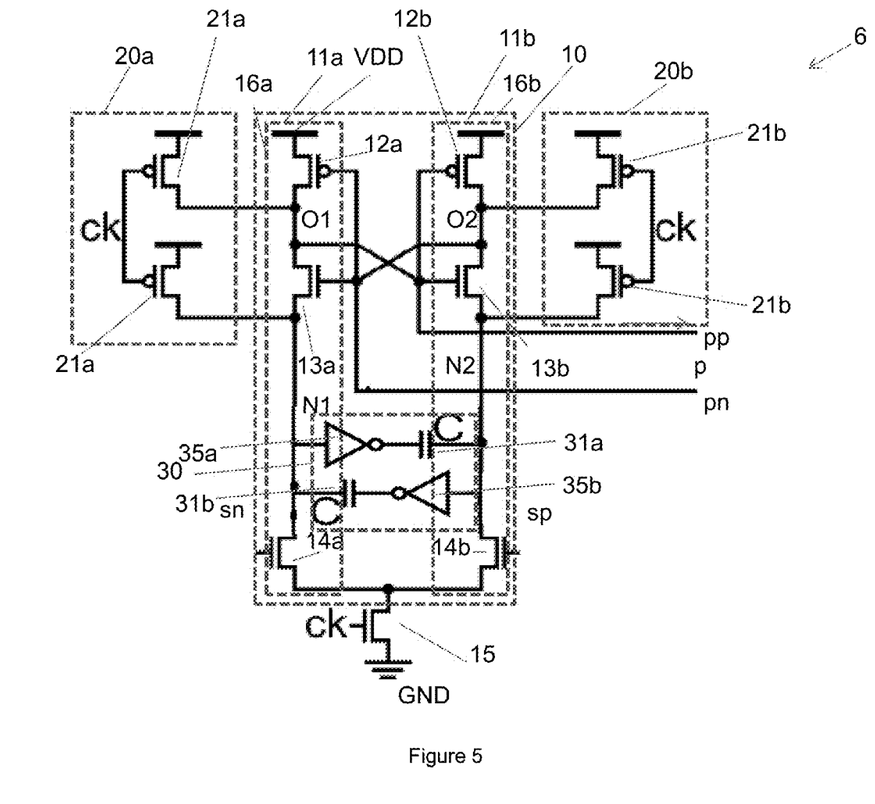
FIG. 5 shows a schematic diagram of a different comparator with a charge injection circuit for use in the analog-to-digital converter of FIG. 1.

FIG. 5 shows an alternative approach to provide a charge injection onto the integration nodes N1, N2. In this embodiment, the provision of a further clock signal ck2 can be omitted. The potential difference to shift the charges in the capacitors 31a, 31b is then provided by means of the potential of the respective other integration node N1, N2. In detail, while the first terminals of the first and second capacitors 31a, 31b are also coupled with the first and second integration nodes N1, N2, respectively, the second terminals of the capacitors 31a, 31b are respectively coupled via a respective injection inverter 35a, 35b with the respective other integration node N1, N2. The effect is that when the potentials on the integration nodes N1, N2 drop in the integration cycle, the potentials drop below the switching threshold of the corresponding injection inverters 35a, 35b, so that the corresponding injection inverters 35a, 35b toggle. The potentials of the second terminals of the corresponding capacitors 31a, 31b are thereby raised, as are the potentials on the first terminals of the corresponding capacitors 31a, 31b. The charge injection occurs while the integration nodes N1, N2 are at the threshold potential where the injection inverters 35a, 35b toggle, thereby supplying an amount of charge to slow down the potential drop on the integration nodes N1, N2, as explained above.

It is a further advantage of providing the capacitors 31a, 31b that the overall capacities of the integration nodes N1, N2 are increased. This results in less noise on the integration nodes N1, N2 so that the noise performance is improved.

In the configuration of FIG. 5, a further advantage can be achieved as the switching of the injection inverters 35a, 35b is not simultaneous due to the potential difference on the integration nodes N1, N2. This effect contributes to the amplification of the cross-coupled inverters 16a, 16b as the potential difference seen by the cross-coupled inverters 16a, 16b is increased thereby.

Figure 6:
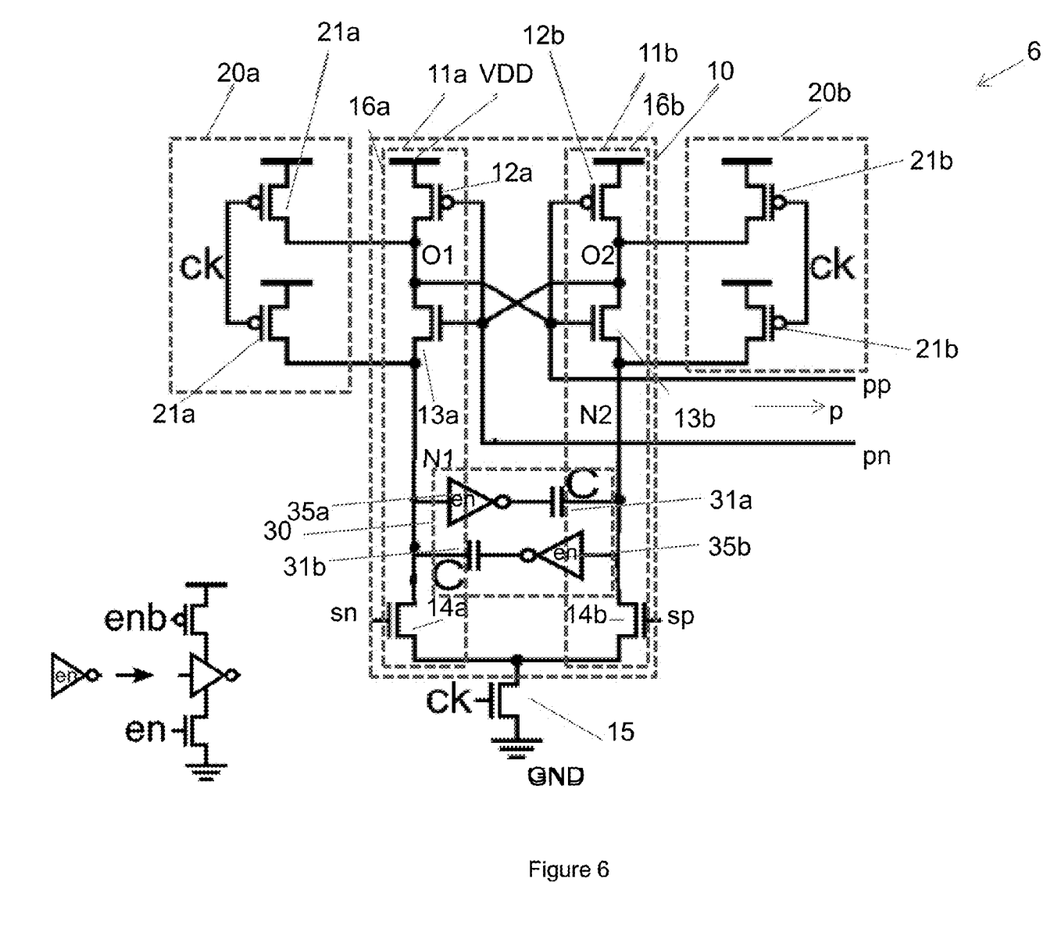
FIG. 6 shows a schematic diagram of the comparator of FIG. 5 including an enable circuitry for selectively applying the charge injection.

FIG. 6 shows a similar configuration, whereby the inverters 35a, 35b have been provided with an enable feature, so that they can be enabled or disabled by a provided enable signal en. Thus, the charge injection circuit 30 according to the embodiment of FIG. 5 can be selectively switched on or off.

What is claimed is:

1. An analog-to-digital comparator, comprising:
a differential amplifier unit wherein the differential amplifier unit receives a sampling signal and provides an output signal based on a voltage provided by the sampling signal, wherein the differential amplifier unit includes:
an input stage wherein the input stage receives the sampling signal and integrates a current on integration nodes based on potentials of the sampling signal;
a sense amplifier coupled with the integration nodes wherein the sense amplifier detects a potential difference and amplifies the potential difference to generate the output signal; and
a charge injection circuit wherein the charge injection circuit comprises injection capacitors each of which is coupled with a respective one of the integration nodes, so that charges are selectively injected into the integration nodes, and wherein each of the injection capacitors of the charge injection circuit is coupled with one first terminal thereof with a respective one of the integration nodes, wherein by changing a potential on a second terminal of the injection capacitors during the integration cycle charges are injected into the integration nodes, and wherein the charge injection circuit injects equal charges into the integration nodes.

2. The comparator according to claim 1, wherein the sense amplifier includes cross-coupled inverters.

3. The comparator according to claim 2, wherein one terminal of each of the cross-coupled inverters is coupled with a respective one of the integration nodes, so that the voltage over the cross-coupled inverters depends on the potential on the respective integration node.

4. The comparator according to claim 3, wherein charges are selectively injected into the integration nodes before the voltage over the cross-coupled inverters reaches a value at which the sense amplifier becomes operational.

5. The comparator according to claim 1, wherein the differential amplifier unit is configured to be operated in a regeneration cycle and an integration cycle according to a provided clock signal, wherein in the regeneration cycle the differential amplifier unit is deactivated and the integration nodes are charged with a predefined reference potential and wherein in the integration cycle the differential amplifier unit is activated and charges are injected into the integration nodes.

6. The comparator according to claim 1, wherein the alteration of the potential on the second terminal of the injection capacitors is caused by the clock signal or a delayed further clock signal.

7. The comparator according to claim 1, wherein the alteration of the potential on the second terminal of the injection capacitors is provided by an output of an inverter associated with each of the injection capacitors.

8. The comparator according to claim 7, wherein the input of each of the inverters coupled with a respective one of the injection capacitors is either coupled with an inverted clock signal or with the integration node associated with the respective other of the injection capacitors, so that the potential change on the integration node is controlled by the potential change of the respective other integration node.

9. The comparator according to claim 1, wherein the charge injection circuit is configured to be selectively enabled by a provided enable signal, so that charges are injected into the integration nodes depending on the enable signal.

* * * * *